United States Patent
Spencer

(10) Patent No.: US 7,831,884 B2
(45) Date of Patent: Nov. 9, 2010

(54) METHOD OF CORRECTING MESSAGE ERRORS USING CYCLIC REDUNDANCY CHECKS

(75) Inventor: Quentin Spencer, St. Louis, MO (US)

(73) Assignee: Aclara Power-Line Systems Inc., St. Louis, MO (US)

( * ) Notice: Subject to any disclaimer, the term of this patent is extended or adjusted under 35 U.S.C. 154(b) by 138 days.

(21) Appl. No.: 11/836,381

(22) Filed: Aug. 9, 2007

(65) Prior Publication Data

US 2008/0040644 A1 Feb. 14, 2008

Related U.S. Application Data

(60) Provisional application No. 60/837,349, filed on Aug. 11, 2006.

(51) Int. Cl.
*H03M 13/00* (2006.01)
(52) U.S. Cl. ........................ 714/755; 714/781
(58) Field of Classification Search ............. 714/755, 714/781
See application file for complete search history.

(56) References Cited

U.S. PATENT DOCUMENTS

| | | | | |
|---|---|---|---|---|
| 4,058,672 A * | 11/1977 | Crager et al. | ................ | 370/394 |
| 4,442,492 A * | 4/1984 | Karlsson et al. | ............. | 705/412 |
| 5,535,227 A * | 7/1996 | Silvano | ....................... | 714/766 |
| 5,563,894 A * | 10/1996 | Fujiwara et al. | ............. | 714/785 |
| 5,781,568 A * | 7/1998 | Hsieh | .......................... | 714/767 |
| 6,085,349 A * | 7/2000 | Stein | ........................... | 714/778 |
| 6,470,472 B1 * | 10/2002 | Johansson | .................... | 714/785 |
| 6,662,332 B1 * | 12/2003 | Kimmitt | ..................... | 714/762 |
| 6,691,278 B1 * | 2/2004 | Patapoutian et al. | ........ | 714/801 |
| 7,089,485 B2 * | 8/2006 | Azadet et al. | ............... | 714/798 |
| 7,519,898 B2 * | 4/2009 | Narayanan et al. | .......... | 714/801 |

OTHER PUBLICATIONS

Dian-Wu Yue; Shwedyk, E.; Turbo decoding of linear block codes; IEEE Pacific Rim Conference on Communications, Computers and signal Processing, vol. 1, Aug. 26-28, 2001 pp. 107-110.*

V. Kumar and O. Milenkovic, "On graphical representations of algebraic codes suitable for iterative decoding," IEEE Communications Letters, vol. 9, pp. 729-731, Aug. 2005.*

* cited by examiner

*Primary Examiner*—Joseph D Torres
(74) *Attorney, Agent, or Firm*—Polster, Lieder, Woodruff & Lucchesi, LLC

(57) ABSTRACT

A method of correcting errors in a message transmitted over a digital communication channel, where the message was encoded using a CRC for purposes of error detection. A parity-check matrix representation of the CRC is computed for any fixed-length message, and that parity-check matrix is combined with the parity-check matrix for any error correcting code that used in conjunction with the CRC. The combined parity-check matrix is extended using sparsification algorithms to allow it to work well under a message passing decoder (MPD). Received messages are decoded using the message passing decoder, making it possible to correct more errors than if the CRC were decoded in a conventional manner.

3 Claims, 2 Drawing Sheets

METHOD OF CORRECTING MESSAGE ERRORS USING CYCLIC REDUNDANCY CHECKS

CROSS-REFERENCE TO RELATED APPLICATIONS

The present application is related to and claims priority from U.S. Provisional Patent Application Ser. No. 60/837,349 filed on Aug. 11, 2006, which is herein incorporated by reference.

STATEMENT REGARDING FEDERALLY SPONSORED RESEARCH

Not Applicable.

BACKGROUND OF THE INVENTION

This invention relates to a method of error detection and correction in messages sent over a digital communications channel. Specifically, the method uses cyclic redundancy checks (CRCs), which previously have only been used for error detection, to provide a certain amount of correction in messages where errors are detected. One practical application of the method described herein relates to error detection in messages sent over a power distribution system employing a TWACS® communication system to send and receive messages over electrical power lines to acquire information on the status of power users, including current power usage. In particular, the method of error detection is described for inbound TWACS communications; i.e., messages sent from a user's location back to a utility in response to a message (an outbound communication) sent from the utility to the user.

In recent years, there has been substantial progress in the area of error correction codes. Most of the gains have been achieved using iterative coding techniques and new classes of codes designed to perform well with such coding methods. These new classes of codes include, for example, Turbo-codes and Low-Density Parity-Check (LDPC) codes. While these codes are being incorporated into standards for next-generation communication systems, there remain many "legacy" communication systems and protocols that use more traditional methods of error detection and correction, and are likely to be used well into the foreseeable future. These systems and protocols would benefit from the use of iterative decoding techniques. In particular, message passing decoders (MPDs), which are also referred to as belief-propagation decoders, used with LDPC codes could theoretically be used with any linear block code. In practice, an MPD performs best when the parity-check matrix block code is sparse (i.e., there are very few 1s compared to the number of 0s). Thus the need for a low-density parity-check matrix. However, most commonly used block codes, such as Hamming, BCH, and Reed-Solomon codes, do not have sparse parity check matrices. Because of this, they have not usually been thought of as candidates for using an MPD. There are, however, methods for extending dense parity-check matrices so they have a sparse structure better suited for message passing decoding. Using these sparsification methods, it has been shown that improved performance can be achieved with these older classes of codes; although this comes at the cost of computational complexity, and the performance does not surpass that of good LDPC codes.

CRCs are widely used in digital communication systems for error detection. Typically, a CRC of a fixed length (most commonly 16 or 32 bits, although other lengths are also used) is computed and appended to a message to be transmitted. The receiver of the transmitted message recomputes the CRC to determine if an error has occurred in transmission. Depending upon the application, a detected error often results in a request for a retransmission of the message. In many applications, CRC based error detection is also combined with some form of error correction. The choice of an error correcting code, the CRC used, and the protocol for handling detected errors, are all design decisions that are determined for each application, and depend upon such factors as the expected probability of an error, tolerance for errors in a received message, and the costs of bandwidth and latency in the system.

In some communication systems, errors are relatively rare, and the bandwidth is sufficiently high that retransmission of a message does not have a significant impact (the Ethernet protocol is an example of this). Conversely, some communications are quite noisy and error prone, and retransmissions are commonplace. Reducing the frequency of retransmissions can save valuable bandwidth, particularly in systems whose underlying data rates are low. An example of this is a TWACS powerline communications system, which will be used hereafter as an example of how the method of the invention functions. In a TWACS outbound communications, each message is encoded using a Hamming code and a 16 bit CRC. Since a Hamming code is only able to correct one error, the CRC is used to detect whether more than one error has occurred, so a retransmission can be requested. In practice, however, it is theoretically possible for some errors to go undetected.

In order to improve performance, an LPDC code has been designed for TWACS (see cross referenced U.S. patent application Ser. No. 11/232,072) which should help to overcome some of these shortcomings. However, improving the error detection and correction capability of the Hamming/CRC error control scheme would also benefit the large, currently installed base of TWACS transponders. The scope of the present invention is a method of using CRC bits to correct errors, thereby improving overall error rates. As described hereinafter, the method can be used with a message with only a CRC, or with messages that combine a CRC with a block error correcting code.

BRIEF SUMMARY OF THE INVENTION

The present invention is directed to a method of correcting errors in a message of a fixed length that includes CRC parity check bits for error detection. The method includes generating a parity check matrix representation of the CRC which can be applied to any type of CRC regardless of its size or generator polynomial. If a message is also encoded with a block error correcting code such as a Hamming, BCH, Reed-Muller, or Reed-Solomon code, the parity-check matrix is combined with the parity check matrix for the error correcting code to comprise a single parity-check matrix. Because the resulting matrix is not expected to be a sparse matrix, sparsification techniques are utilized to improve its performance for message passing decoding. The result is a reduction in the packet error rate of the communications channel.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings, which form a part of the specification.

Corresponding reference characters indicate corresponding parts throughout the several views of the drawings.

DESCRIPTION OF THE PREFERRED EMBODIMENT

The following detailed description illustrates the invention by way of example and not by way of limitation. This description will clearly enable one skilled in the art to make and use the invention, and describes several embodiments, adaptations, variations, alternatives and uses of the invention, including what I presently believe is the best mode of carrying out the invention. As various changes could be made in the above constructions without departing from the scope of the invention, it is intended that all matter contained in the above description or shown in the accompanying drawings shall be interpreted as illustrative and not in a limiting sense.

Figure 1:
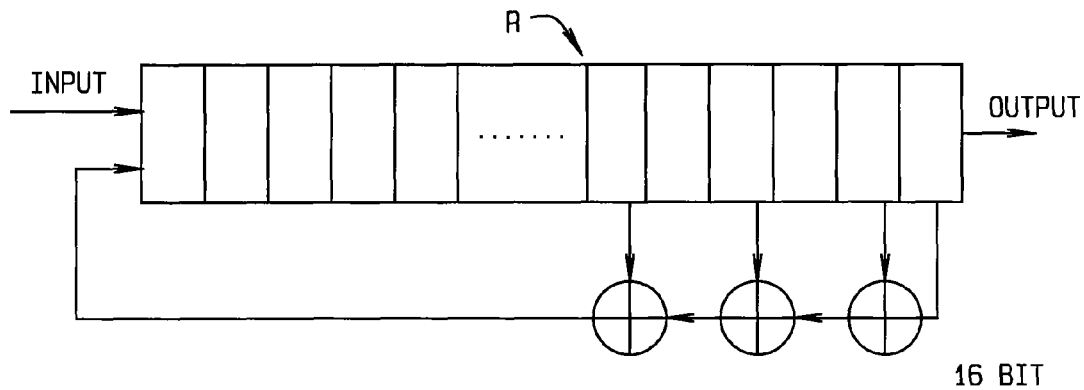
FIG. 1 is a representation of a linear feedback shift register.

Traditionally, a CRC has been implemented using a linear feedback shift register (LFSR) such as the 16 bit register R shown in FIG. 1. This is because of the shift register's very low cost when implemented in hardware. However, the serial nature of the register is not sufficiently fast for some applications. As is known in the art, alternate designs have been proposed that compute a CRC for an entire block in parallel. The first step in using the CRC to create errors is to create a parity check matrix representation of the CRC using methods similar to those for parallelization.

One way of viewing parallelization algorithms is to consider the CRC as a linear filter which, because it has feedback, functions similarly to an infinite impulse response (IIR) filter. As with any linear IIR filter, its impulse response can be calculated for finite length responses. For example, a CRC-16 is to be computed for messages of a 32 bit length. The message comprises mostly 0s, having 1 bits only at locations 2, 17, 30, and 31, so to appear as:

01000000000000001000000000000110

The computed CRC for this message is all zeros. If the CRC were computed for four (4) separate sequences, where each sequence consisted of all 0s and a single 1 in the same four bit locations, the respective CRCs would be:

10000000000000110
10000000000000000
0000000000000100
0000000000000010

I

It will be noted that the modulo-2 sum of the four bit patterns is all 0s, which illustrates the linearity of the CRC. That is, the CRC of the sum of two sequences is equal to the sum of the CRCs of the individual sequences. This property of CRCs can be extended to produce the equivalent of a parity check matrix for the CRC. For messages of a 32 bit length, this is accomplished by computing the CRC of each 32 bit sequence containing exactly one 1. The output of each CRC computation represents one column of the parity check matrix. For the CRC-16, the 16×32 matrix resulting from this operation is:

11011111111111111000000000000000
00110000000000000100000000000000
00011000000000000010000000000000
00001100000000000001000000000000
00000110000000000000100000000000
00000011000000000000010000000000
00000001100000000000001000000000
00000000110000000000000100000000
00000000011000000000000010000000
00000000001100000000000001000000
00000000000110000000000000100000
00000000000011000000000000010000
10000000000001100000000000001000
01000000000000110000000000000100
01111111111111100000000000000010
10111111111111110000000000000001

This same procedure can be used to generate parity-check matrix representations for any type of CRC, as long as the maximum packet length to be supported is known in advance, which is true for many communication protocols. If no other error correction is being used, the CRC parity-check matrix can then be used in the error correction procedure discussed below. If the CRC is used in conjunction with another error correcting code, the two parity-check matrices can be combined into a single parity-check matrix. If $H_{ECC}$ is the parity-check matrix for the error correcting code and $H_{CRC}$ is the parity-check matrix generated for the CRC, then a combined parity-check matrix H is created by "stacking" the two matrices as follows:

$$H = \begin{bmatrix} H_{ECC} \\ H_{CRC} & 0 \end{bmatrix}.$$

Note that a matrix containing all zeros is added to the right of the CRC matrix. This is because typically the CRC is encoded first, and then the CRC-encoded message is passed through the second code, so that the dimensions of the error correcting code's parity-check matrix will be larger than that of the CRC matrix. If, for example, a (255, 247) Hamming code is used in conjunction with a CRC-16, the dimensions of the zero matrix are 16×8, since the Hamming code adds 8 bits of additional redundancy.

After a parity-check matrix is defined, an MPD can be used to decode messages and possibly correct errors. The MPD attempts to find the most likely transmitted codeword that satisfies the operating constraint that all parity checks are zero. If a stacked parity-check matrix is used, the MPD finds a codeword that simultaneously satisfies the constraints set by the CRC and the error correcting code. The main problem with this approach is that the MPD has been shown to work best when the parity-check matrix is sparse, meaning that it contains a relatively few number of 1s. CRC parity-check matrices and most parity-check codes are not sparse, with the exception of LDPC codes which are specifically designed to be sparse. With a non-sparse parity-check matrix, the MPD can still be used, but the performance is degraded.

The performance of decoding with dense parity-check matrices has been improved significantly using recent advances in this area such as described by S. Sankaranarayanan and B. Vasic "*Iterative decoding of linear block codes: A parity check orthogonalization approach,*" IEEE Transactions on Information Theory, vol. 51, pp. 3347-3353, September, 2005, and V. Kumar and O. Milenkovic, "*On graphical representations of algebraic codes suitable for iterative decoding,*" IEEE Communications Letters, vol. 9, pp 729-731, August, 2005. The methods described by the authors of these articles make it possible to create alternate representations of these codes that are more sparse and therefore improve the performance of the older codes. Such alternate representations are based on the premise of adding auxiliary variables to the code; or, additional variables that are not transmitted, but are included in the parity check, and must be estimated by the decoder.

To model this mathematically, suppose a matrix H is the base parity-check matrix for a given code, such that a vector c is a valid codeword if Hc=0. If additional columns are now appended to matrix H, so that:

$$H' = [H\ N]$$

then there exists a vector x such that:

$$H' \begin{bmatrix} c \\ x \end{bmatrix} = Hc + Nx = 0$$

The algorithm proposed by Sankaranarayanan and Vasic, and modified by Kumar and Milenkovic, now provide a process to eliminate all cycles in a code of length 4. The procedure is an iterative process where, at each step, a new row and column are added to the matrix, such that the resulting extended parity-check matrix takes the form:

$$H' = \begin{bmatrix} H & N^{(1)} \\ N^{(2)} & N^{(3)} \end{bmatrix}.$$

where $N^{(3)}$ is a square matrix. As indicated above, the extra rows and columns in the H matrix are not transmitted, but rather are treated as internal state variables within the MPD. Each value is initially set to 0 at the beginning of a decoding operation, and the most likely correct values for each variable are estimated during the decoding process. It will be appreciated that "guessing" at unknown state variables to decode a message will potentially hinder decoder performance. However, there is a trade-off in that all cycles of length 4 can be removed from the code. For a relatively dense parity-check matrix, such as that produced by a Hamming code, the resulting improvement in performance is sufficient to offset any losses due to the presence of these additional variables.

A practical application of the method is now described.

Figure 3:
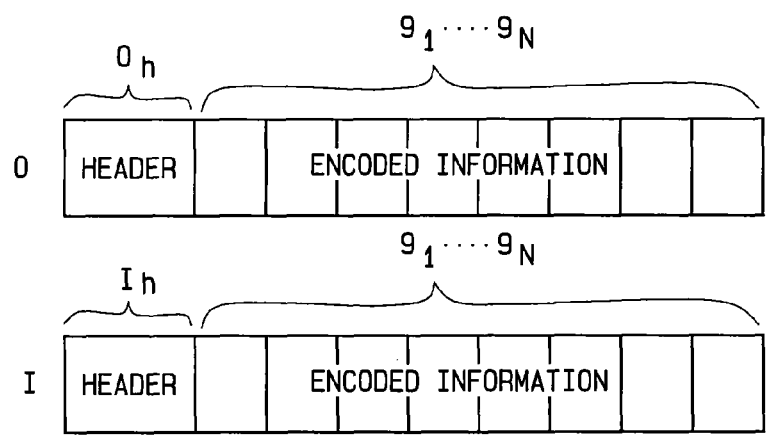
Figure 2:
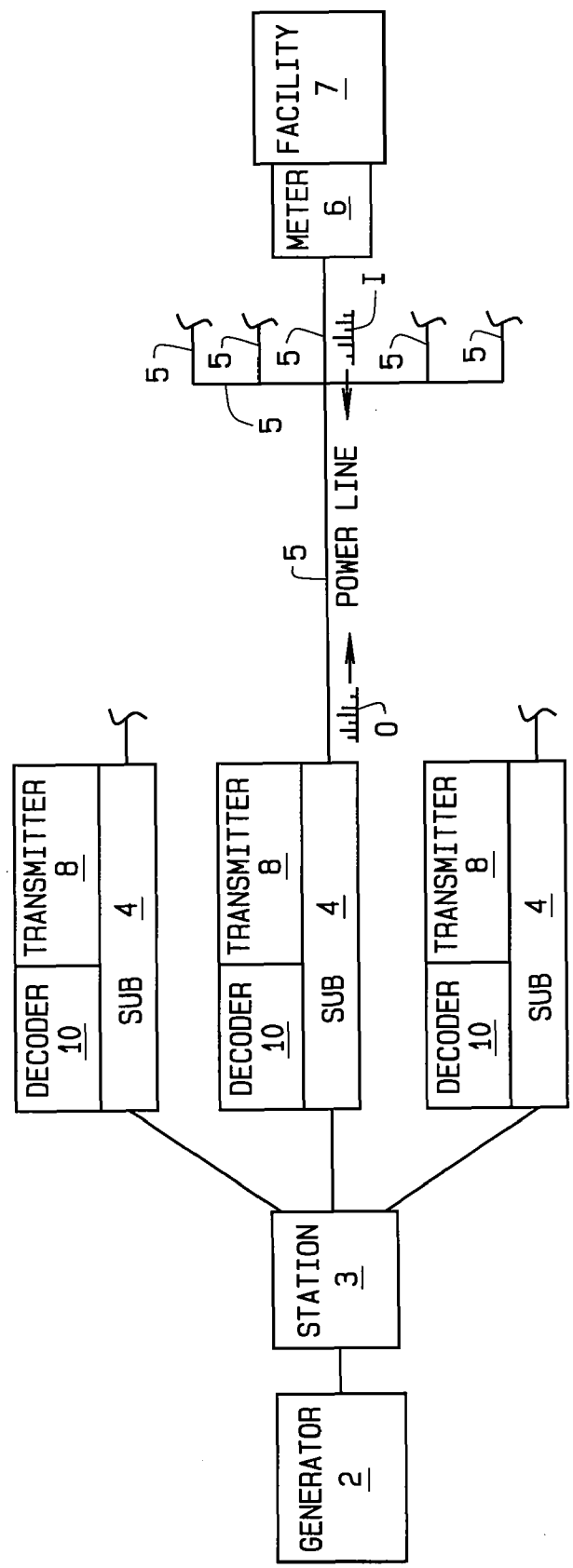
FIG. 2 is a simplified representation of an electrical distribution network including a two-way communications capability; and, FIG. 3 is a representation of an outbound or inbound communications signal sent over the network.

Referring now to FIG. 2, an electrical distribution system 1 includes a generator 2 for producing electrical energy. The energy is routed through various stations 3 and sub-stations 4 over power lines 5, and through electricity meters 6 into user facilities 7 such as homes, factories, office buildings, etc. Efficient operation of the system requires real time information as to current energy demand, possible overload conditions, outage occurrences, and related conditions. For this purpose, a two-way communications system TWACS T includes a transmitter or transponder 8 located at a sub-station 4 or the like for generating and transmitting an encoded "outbound" message O to an end user location over power line 5. At the location, the message is received and decoded by a transponder (not shown) incorporated in meter 6. In reply to the outbound message, a coded "inbound" message I is formulated and sent back by the transponder to the sub-station over the power line. An example of an outbound or inbound signal is shown in FIG. 3 as having a message header Oh or Ih which includes the address to which the message is being sent and related information, and a series of encoded message bits conveying the relevant information. As is known in the art, the message is divided into blocks $9_1$-$9_n$ of encoded data. While not shown in the drawings, conventional electrical distribution systems are typically three-phase (3φ) systems and the TWACS sends and receives messages concurrently over more than one phase. A message passing decoder 10 is utilized at the substation to detect for, and correct, errors in the received and decoded inbound message which are caused, for example, by noise on the transmission line over which the message is sent.

As noted above, a message passing decoder is commonly used to decode LDPC codes. Unlike traditional algebraic decoders, an MPD uses "soft" rather than "hard" decision inputs. That is, rather than determining whether a bit is a "1" or a "0" before using a decoder to correct for an error, with an MPD, the final decision is not made until after the decoding step, and the MPD uses real-valued inputs that indicate whether a particular bit is a 1 or a 0. That is because this information makes it easier to decode multiple bit errors. For example, using hard decisions, a standard Hamming decoder can only correct only 1 bit error per message. With an MPD, if two bits are in error, but barely cross a threshold of being detected as the wrong bit, the MPD will often correct both bits, thereby exceeding the error-correcting capability of the Hamming decoder.

As previously noted, a 16-bit cyclic redundancy check, or CRC-16, is included in all TWACS messages, and is used to detect whether a message has been correctly received. If the CRC is converted into a parity-check matrix format as described above, it can be used as part of the MPD to provide an additional error correction capability.

It is important to note that the Hamming code used in TWACS is a "shortened" code; that is, the number of input bits is less than the maximum of 247 a (255,247) Hamming code is capable of encoding. When using the MPD, any unused bits are assumed to be 0s. This allows a single parity-check matrix to be used for a variety of different message lengths. As a result of this, for example, the first column of the Hamming parity-check matrix for a 10-byte message will be the same as the first column of the matrix from an 11-byte message. This is not true for a CRC-based parity check matrix. With the CRC, the first column of the parity-check matrix for the same 10-byte message is the same as the ninth column of the matrix for the 11-byte message. It is therefore not possible to define a single combined parity-check matrix for all sizes of message inputs. However, TWACS inbound messages only occur in sizes ranging from 4 to 20 bytes. Accordingly, there are only 17 possible parity-check matrices which need to be computed and stored in advance to handle all the possible TWACS inbound messages.

In view of the above, it will be seen that the several objects and advantages of the present invention have been achieved and other advantageous results have been obtained.

Having thus described the invention, what is claimed and desired to be secured by Letters Patent is:

1. A method for correcting errors in a message received over a digital communications path, the message having been encoded with a cyclic redundancy check for error detection, the method comprising:

passing the message through a message passing decoder used for performing low-density parity checks, the message passing decoder employing a parity check matrix derived by expressing the cyclic redundancy check in a matrix format and then applying a sparsification algorithm to the matrix with the resulting matrix being an extended parity check matrix suitable for decoding the message using the message passing decoder; and, the parity check matrix derived from the cyclic redundancy check being combined with a parity check matrix for any other block code used in the message, whereby all codes are represented by a single, sparsified parity check matrix.

2. The method of claim 1 in which all code cycles of a length 4 are eliminated from the extended parity check matrix.

3. The method of claim 1 in which the cyclic redundancy check is a 16 or 32 bit cyclic redundancy check.

* * * * *